(12) United States Patent
Hayashi

(10) Patent No.: US 8,027,089 B2
(45) Date of Patent: Sep. 27, 2011

(54) MINUTE STRUCTURE AND ITS MANUFACTURING METHOD

(75) Inventor: Masatoshi Hayashi, Fujisawa (JP)

(73) Assignee: Nikon Corporation, Tokyo (JP)

( * ) Notice: Subject to any disclaimer, the term of this patent is extended or adjusted under 35 U.S.C. 154(b) by 323 days.

(21) Appl. No.: 11/992,987

(22) PCT Filed: Oct. 2, 2006

(86) PCT No.: PCT/JP2006/319718
§ 371 (c)(1),
(2), (4) Date: Apr. 2, 2008

(87) PCT Pub. No.: WO2007/043383
PCT Pub. Date: Apr. 19, 2007

(65) Prior Publication Data
US 2009/0180185 A1    Jul. 16, 2009

(30) Foreign Application Priority Data
Oct. 7, 2005   (JP) .................................. 2005-295490

(51) Int. Cl.
*G02B 5/18* (2006.01)

(52) U.S. Cl. ......... 359/566; 359/576; 359/896; 359/900
(58) Field of Classification Search .................. 359/566, 359/576, 580, 582, 896, 900
See application file for complete search history.

(56) References Cited

U.S. PATENT DOCUMENTS

| | | | | |
|---|---|---|---|---|
| 6,462,875 | B1 * | 10/2002 | Ishii | 359/576 |
| 6,521,136 | B1 * | 2/2003 | Sfez et al. | 216/24 |
| 6,523,963 | B2 * | 2/2003 | Nakabayashi | 359/513 |
| 6,870,677 | B2 * | 3/2005 | Ohgane | 359/565 |
| 6,965,476 | B2 * | 11/2005 | Sato | 359/569 |
| 6,967,796 | B2 * | 11/2005 | Takeuchi et al. | 359/576 |
| 7,031,078 | B2 * | 4/2006 | Ukuda | 359/741 |
| 2001/0026399 | A1 * | 10/2001 | Nakabayashi et al. | 359/576 |
| 2002/0024734 | A1 | 2/2002 | Nakabayashi | |
| 2006/0171031 | A1 * | 8/2006 | Suzuki | 359/565 |
| 2007/0281022 | A1 * | 12/2007 | Bunick et al. | 424/472 |
| 2010/0151608 | A1 * | 6/2010 | Onishi et al. | 438/32 |

FOREIGN PATENT DOCUMENTS

| | | |
|---|---|---|
| JP | A-11-223717 | 8/1999 |
| JP | A-2002-71923 | 3/2002 |

* cited by examiner

*Primary Examiner* — Frank Font
(74) *Attorney, Agent, or Firm* — Oliff & Berridge, PLC

(57) ABSTRACT

A manufacturing method of a minute structure having fine structures on opposing inner surfaces, includes the steps of forming a first pattern in a surface of a first layer, forming a sacrificial layer on the patterned surface of the first layer, forming a second pattern on a surface of the sacrificial layer, forming a second layer on the sacrificial layer and a portion of the surface of the first layer, and removing a member constituting the sacrificial layer. In the step of forming the first pattern on the first layer and the step of forming the second pattern on the sacrificial layer, the patterns are formed using the same alignment marks as references. This manufacturing method can realize highly accurate alignment even when plural lenses or DOEs are used.

14 Claims, 13 Drawing Sheets

MINUTE STRUCTURE AND ITS MANUFACTURING METHOD

CROSS-REFERENCE TO RELATED APPLICATION

This application is a U.S. National Stage application claiming the benefit of prior filed International Application Number PCT/JP2006/319718, filed Oct. 2, 2006, in which the International Application claims a priority date of Oct. 7, 2005 based on prior filed Japanese Application Number 2005-295490, the entire contents of which are incorporated herein by reference.

TECHNICAL FIELD

The present invention relates to a minute structure which is manufactured by using a semiconductor process as well as to its manufacturing method.

BACKGROUND ART

In recent years, semiconductor devices in which a resin structure is provided on a semiconductor element by using a semiconductor process have increased. For example, an MLA (microlens array) and a DOE (diffraction optical element) are known in which a lens is formed on an image sensor such as a CCD or a CMOS in an integral manner.

In particular, plural MLAs or DOEs are used frequently for complex processing for increase in focusing efficiency, color difference correction, or the like. For employing plural MLAs or DOEs, the alignment accuracy and its adjustment during manufacture are important.

Patent Document 1 entitled "Diffraction Optical Element and Optical System Using It" discloses a method for improving the wavelength dependency of the diffraction efficiency using diffraction optical elements that are accumulated in two or more stacked layers on a substrate. In this document, a technique is introduced in which the edges of each diffraction grating can be caused to assume obtuse angles by chamfering the edge portion of each grating portion, whereby the processability of a grating shape at the time of cutting or the like and the shape transferability at the time of molding of edge portions are increased. Patent Document 1: Japanese Unexamined Patent Application Publication No. H11-223717

DISCLOSURE

Problems to be Solved

Where plural MLAs or DOEs are combined together, influence that is undesirable for an optical instrument such as a color shift or diffused reflection occurs if the accuracy of the alignment between optical elements is low. In particular, in optical elements in a coupler for coupling optical fibers of 10 μm or less in diameter such as single-mode optical fibers, even an axis displacement as small as about 1 μm between optical elements causes serious loss of coupling.

Also, a structure that two or more DOE layers are stacked as in Patent Document 1 is associated with a problem that a displacement between stacked edges lowers the diffraction efficiency.

An object of the present invention is therefore to provide a minute structure and its manufacturing method which can realize highly accurate alignment even in a configuration using plural MLAs or DOEs.

Means for Solving the Problems

The present invention provides a manufacturing method of a minute structure having fine structures on opposing inner surfaces, including the steps of forming a first pattern on a surface of a first layer, forming a sacrificial layer on the patterned surface of the first layer, forming a second pattern on a surface of the sacrificial layer, forming a second layer on the sacrificial layer and a portion of the surface of the first layer, and removing a material including the sacrificial layer, the manufacturing method further includes in the step of forming the first pattern on the first layer and the step of forming the second pattern on the sacrificial layer, the patterns are formed using the same alignment marks as references.

The manufacturing method includes the steps of forming the second layer so that the sacrificial layer is covered with the second layer, and exposing a portion of the sacrificial layer by removing a portion of the first layer or the second layer. The manufacturing method further includes the step of attaching a cover to an exposed portion of the sacrificial layer after removing the member constituting the sacrificial layer through the exposed portion.

The manufacturing method further includes the step of filling a hollow portion that is obtained by removing the member constituting the sacrificial layer with a medium other than air.

The present invention also provides a manufacturing method of a minute structure, in which the minute structure has a first member in which a first pattern and a concave or convex alignment mark are formed and a second member having a second pattern and an alignment mark that is shaped so as to be able to be fitted with and into the alignment mark formed in the first member, the minute structure being formed by fitting the alignment marks of the first member and the second member with and into each other. The manufacturing method comprises the steps of forming a shape of at least a mold portion for forming the alignment mark of a mold for forming the first member, from a mold master by an even number of transcript operations, and forming a shape of at least a mold portion for forming the alignment mark of a mold for forming the second member, from the mold master by an odd number of transcript operations.

In the manufacturing method of the present invention, the alignment mark of one of the first member and the second member further has a concave shape and a side surface of a concave portion being inclined so that a bottom portion of the concave shape is smaller in area than an opening of the concave shape.

In particular, one of the alignment marks and the other of the alignment marks have a convex shape and a concave shape as pair shapes, and are formed in such a manner that a height of the convex-shaped alignment mark is smaller than a depth of the concave-shaped alignment mark.

The manufacturing method further includes the step of filling a hollow portion with a medium other than air when the first member and the second member are fitted with and into each other aligning to the alignment mark.

Furthermore, the present invention provides a minute optical element in which a hollow portion is formed inside so as to be surrounded by a structure made of an optical material that transmits light having a wavelength used, in which hollow-portion-side surfaces of the structure has such three-dimensional shapes as to be able to provide a desired optical characteristic for light having the wavelength used, and the structure is provided with an opening that couples the hollow portion to an outside space of the minute optical element.

In particular, the minute optical element further including a sealing member which covers the opening.

Additionally, shapes of the optical surface are relief patterns that cause a prescribed diffraction phenomenon for light having the wavelength used.

In particular, the optical material is a resin material.

The minute optical element further including substrates made of glass or silicon in areas of the structure that face the outside space.

Still further, the invention provides an optical element having a first optical substrate which is made of an optical material that transmits light having a wavelength used, has, in one surface, three-dimensional shapes capable of providing a desired optical characteristic for light having the wavelength of used, and has a first alignment mark in the one surface outside an area where the three-dimensional shapes are formed, and a second optical substrate which is made of an optical material that transmits light having the wavelength used, has, in one surface, three-dimensional shapes capable of providing a desired optical characteristic for light having the wavelength of used, and has a second alignment mark in the one surface outside an area where the three-dimensional shapes are formed, the first optical substrate and the second optical substrate being joined to each other in a state that the first alignment mark and the second alignment mark are opposed to each other, the optical element in which the first alignment mark and the second alignment mark have a concave shape or a convex shape and are shaped so as to be able to be fitted with and into each other.

In particular, a sectional shape of the convex-shaped one of the first alignment mark and the second alignment mark is such as to be narrowed as the position goes toward a tip.

A sectional shape of the convex-shaped one of the first alignment mark and the second alignment mark is a polygon shape or a shape whose tip portion has curvature.

The minute structure and its manufacturing method according to the present invention can realize highly accurate alignment even in a configuration using plural MLAs or DOEs. In addition, they can provide highly accurate minute structures in a large number at a low cost by molding using molds and enable application to various fields such as sensors.

DETAILED DESCRIPTION OF THE EMBODIMENT

First Embodiment

Figure 1:
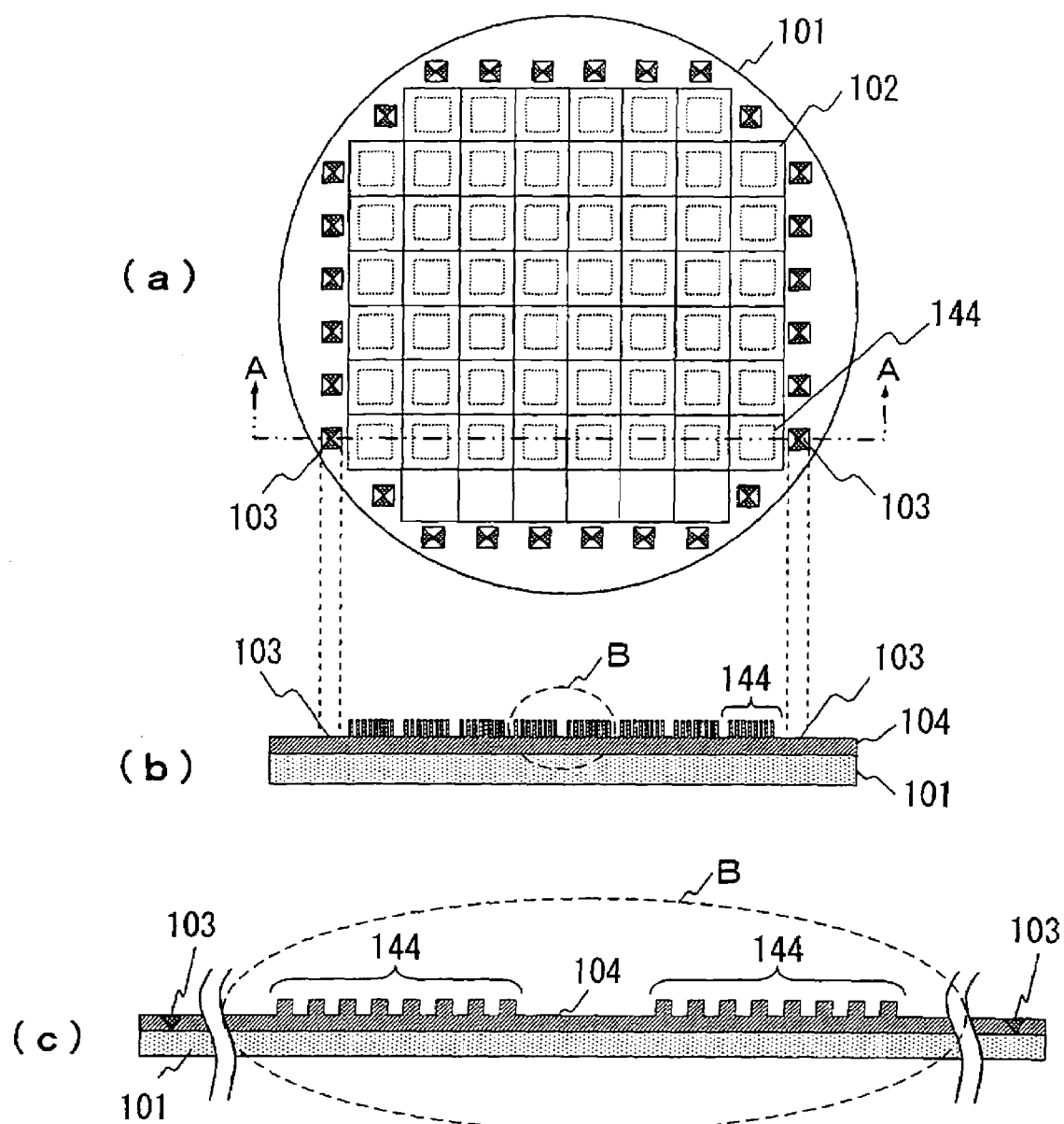
FIG. 1 is explanatory diagrams outlining the whole of a first embodiment of the present invention.

A first embodiment which relates to a minute structure and its manufacturing method according to the present invention will be described below with reference to FIGS. 1-3. FIG. 1 shows how plural minute structures are formed on a silicon wafer. Each minute structure which is manufactured according to the embodiment is used as an optical element and, in particular, is suitably used as a minute optical element formed on a semiconductor device.

In FIG. 1, reference numeral 101 denotes a silicon wafer; 102, blocks in each of which one minute structure is formed; 103, alignment marks; 104, a first layer formed on the silicon wafer 101; and 144, pattern forming portions.

FIG. 1(a) is a top view of a silicon wafer 101. FIG. 1(b) is a sectional view taken at a cutting position A in FIG. 1(a). FIG. 1(c) is an enlarged view mainly showing a part indicated by a broken-line circle B in FIG. 1(b). A first layer 104 is formed on the silicon wafer 101 with a resin or the like, and a desired pattern is formed as each alignment mark 103 and in each block 102. For example, a DOE or an MLA is formed as a desired pattern. As in the case of common semiconductor manufacturing methods using stepper exposure, the alignment marks are provided around the blocks 102 and used as reference positions at the time of exposure.

Although in FIG. 1 the alignment marks 103 are provided on both sides of each row and each column of blocks 102, they may be provided at other positions or in other numbers. Although in FIG. 1 reference numeral 103 is attached to only one alignment mark, other marks that are drawn in the same shape as the one alignment mark are also the same alignment marks. Likewise, reference numeral 102 is attached to one of the plural blocks 102. Since one minute structure is formed in each block, plural minute structures are formed on the one silicon wafer 101 at one time.

The manufacturing method of a minute structure according to the embodiment is to form plural minute structures on a substrate such as a silicon wafer or a quartz wafer. Plural layers are formed on the substrate while being patterned, and plural minute structures formed on the substrate are cut out finally, whereby individual minute structures are completed. As for the methods for patterning or forming individual layers in the embodiment, as in ordinary semiconductor element forming techniques, patterning, film formation, or the like is performed by oxidation, photoresist spreading/photolithography, etching, nanoimprinting, deposition, sputtering, CVD, or the like. The photolithography process, which is a process of patterning an organic material film (photoresist), can form an arbitrary pattern by forming a photoresist layer, forming a latent pattern by ultraviolet ray exposure, and performing development. The photoresist may be of either a positive type or a negative type.

The cross section of each pattern shown in the figure of the first embodiment has a simple rectangular shape. However, an inclination shape can also be formed by using a grayscale mask method, for example, and hence an MLA, a DOE, or the like can be formed.

Next, a manufacturing procedure of a minute structure will be described in detail with reference to FIG. 2 by extracting the part indicated by the broken-like circle B in FIG. 1. In FIG. 2, reference numeral 105 denotes a sacrificial layer; 106, a second layer; and 201, a minute structure that has been cut out for segmentation. Members that are given the same reference numerals as in FIG. 1 are the same as those shown in FIG. 1 and hence will not be described in detail. First, in the process of FIG. 2(a), a resin first layer is formed on the silicon wafer 101 and a photoresist is spread thereon and subjected to stepper exposure in alignment with the alignment marks 103. After a desired pattern is formed by the stepper exposure and development, a pattern 144 as shown in FIG. 2(a) is formed in the first layer 104 by etching or the like.

FIG. 2(b) shows a state that a sacrificial layer 105 made of a photoresist or the like is spread on the patterned first layer 104. Like the first layer 104, the sacrificial layer 105 is subjected to stepper exposure in alignment with the alignment marks 103, whereby a desired pattern is formed therein. Furthermore, a portion of the sacrificial layer 105 that should be removed completely is selectively subjected to additional exposure. Development is performed thereafter, whereby a pattern 145 as shown in FIG. 2(c) is formed in the sacrificial layer 105. That is, a patterned sacrificial layer 105 remains in each minute structure portion. If a grayscale mask method is employed instead of the additional exposure, the exposure for the pattern 145 and the exposure for the portion of the sacrificial layer 105 that should be removed completely can be performed collectively.

Figure 2:
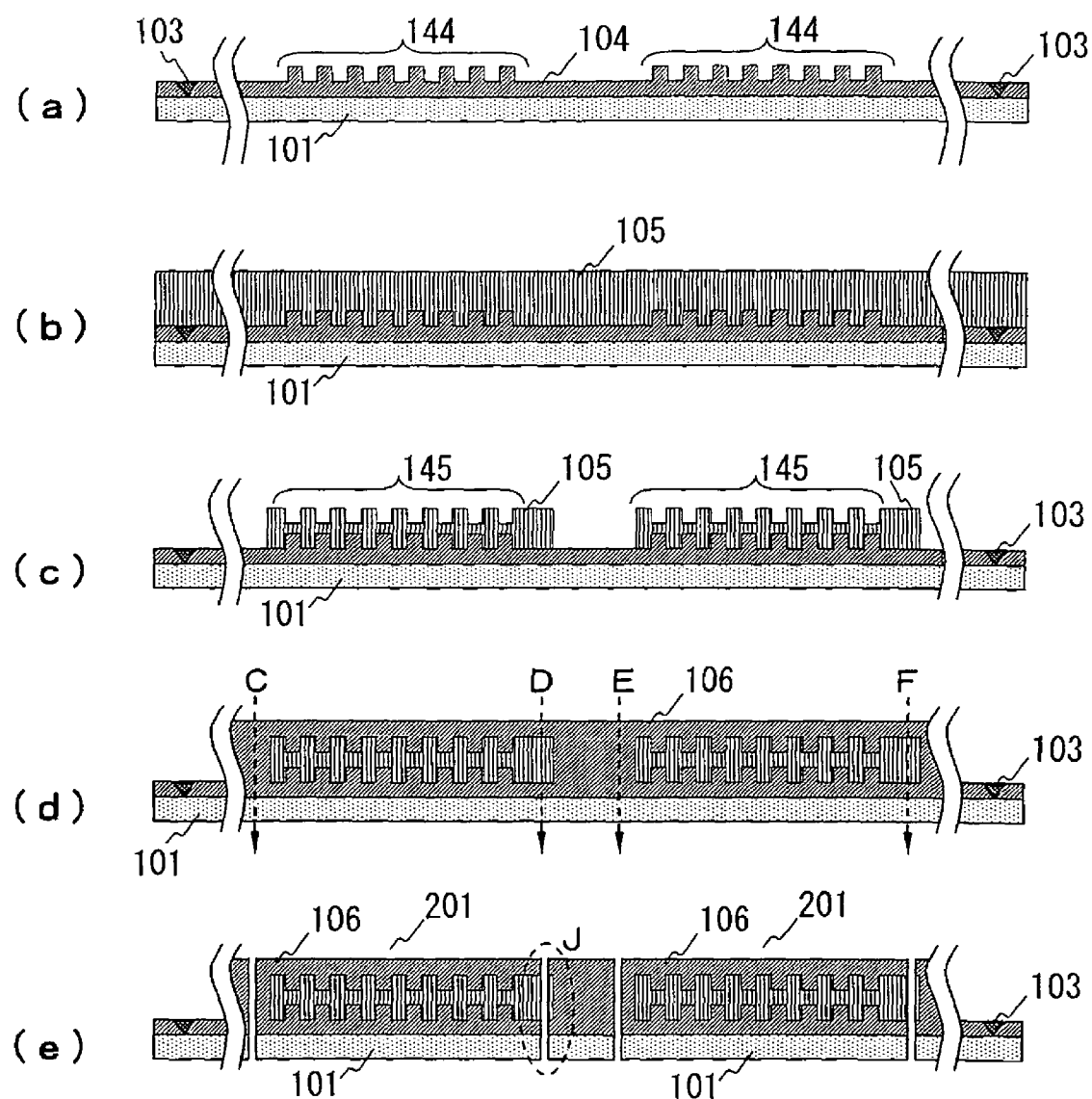
FIG. 2 is explanatory diagrams showing a manufacturing procedure of the first embodiment of the invention.

Next, as shown in FIG. 2(d), a resin is spread as a second layer 106 so as to completely cover the sacrificial layer 105 remaining in each patterned block 102. At this time, the resin is spread so that the second layer 106 is bonded to the exposed portions of the first layer 104. In FIG. 2(d), broken-like arrows C, D, E, and F are cutting lines and show cutting positions of the integral structure of the silicon wafer 101, the first layer 104, the sacrificial layer 105, and the second layer 106. FIG. 2(e) shows a state after cutting and segmentation. A minute structure 201 is cut out in such a manner that a portion of the sacrificial layer 105 is exposed (indicated by a broken-line circle J). Since the constituent figures of FIG. 2 are sectional views taken at the cutting position A in FIG. 1(a), the sacrificial layer 105 is exposed only on the side of the cutting line D or F. That is, the sacrificial layer 105 is exposed only on one of the four sidelines of the rectangle of each minute structure forming block 102 shown in FIG. 1(a), and is covered with the second layer and the first layer or the substrate 101 on the other sidelines. This is seen from FIG. 3(a).

Figure 3:
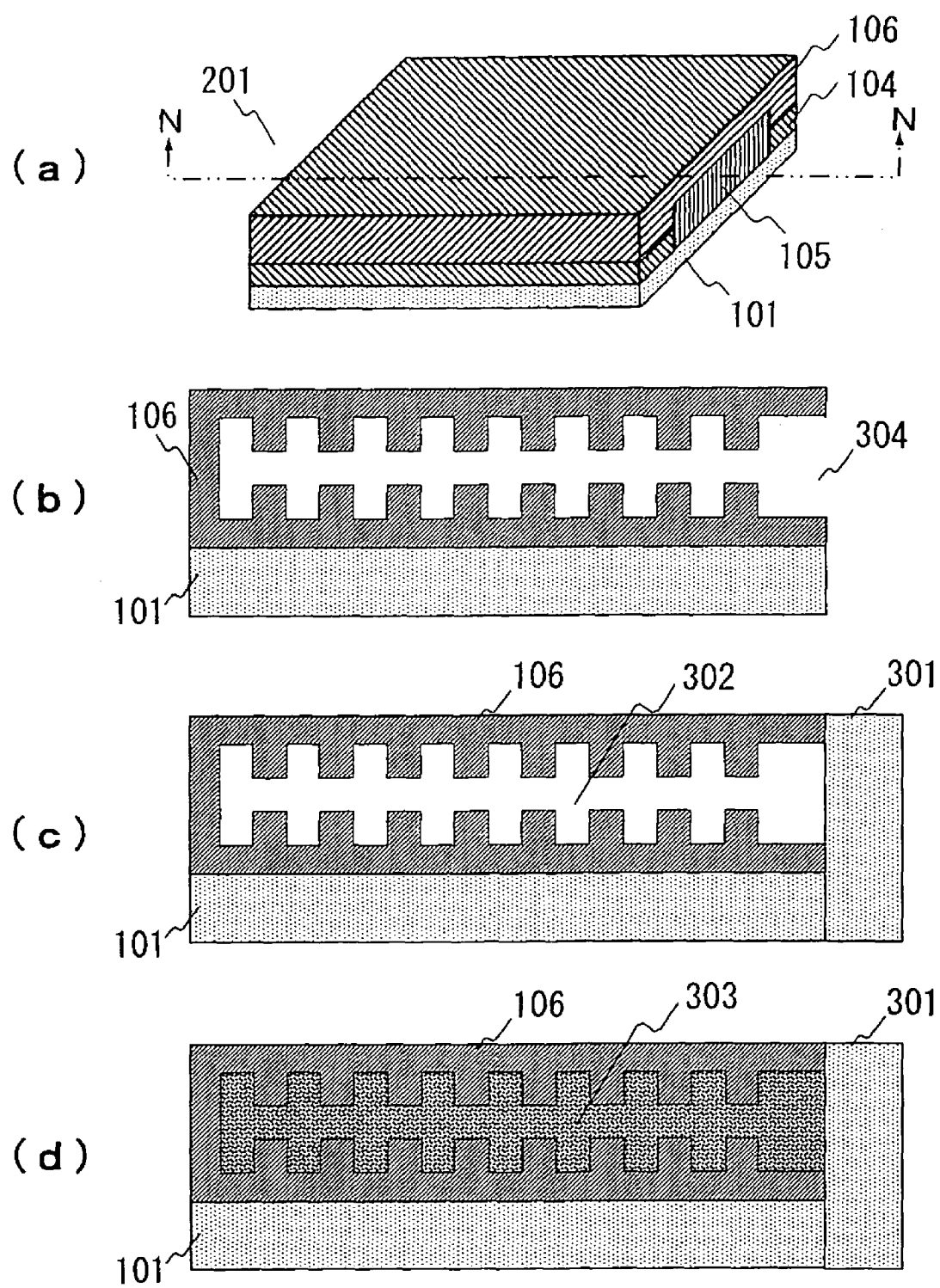
FIG. 3 is explanatory diagrams showing a minute structure of the first embodiment of the invention.

FIG. 3 shows a cut-out minute structure 201. The resist constituting the sacrificial layer 105 which is partially exposed from the minute structure 201 is removed with a resist solvent such as acetone, whereby a hollow minute structure is completed as shown in FIG. 3(b). FIG. 3(b) is a sectional view taken at a cutting position N in FIG. 3(a). An exposed hollow portion 304 corresponds to the exposed portion of the sacrificial layer 105 in FIG. 3(a).

Incidentally, the minute structure manufactured by the above-described manufacturing method is used as an optical element. A substrate that is transparent at a wavelength used such as a glass substrate (e.g., quartz substrate) may be used in place of the silicon wafer 101. Furthermore, a resin(s) that is transparent at the wavelength used is used as the resin(s) that constitutes the first layer 104 and the second layer 106. Still further, if the optical surfaces of the first layer 104 and the second layer 106 that face the hollow portion are formed with relief patterns (e.g., DOE patterns or lens patterns) that cause a desired optical characteristic for obtaining a necessary diffraction phenomenon, for example, at the wavelength used, a minute structure (minute optical element) is obtained that is configured in such a manner that a hollow portion that is surrounded by a structure made of an optical material is formed inside. Where this minute structure is used as it is, since the hollow portion communicates with the outside air, it can be used as a gas sensor or the like for detecting a gas or the like other than air that has flown into the hollow portion by making arrangements for detecting a variation in the characteristic of light passing through the minute structure. Naturally, an inlet and an outlet for a gas or the like can be formed by providing openings as shown in FIG. 3(a) on both sides instead of only one side.

Alternatively, if a cover 301 made of a resin or the like is bonded to the exposed portion in a manner shown in FIG. 3(c), the hollow portion can be sealed up and isolated from the outside air. As a further alternative, a process of sealing up the hollow portion with a cover 301 is executed in a closed chamber filled with a gas other than air, the hollow portion can be filled with the gas other than air. For example, the minute structure can be used as an optical absorption sensor by filling the hollow portion with an inert gas such as an Ar (argon) gas or a Kr (krypton) gas or a nitrogen gas. Instead of a gas, a liquid such as a liquid crystal can be used to fill the hollow portion, whereby the refractive index can be changed or a filtering function is given.

Although in this embodiment the second layer is formed so as to fully cover the sacrificial layer, the second layer may be formed (at the very time when it is laid) so as to expose a portion of the sacrificial layer. Where a portion of the sacrificial layer remains exposed, the sacrificial layer can be removed through that portion. Therefore, the sacrificial layers can be removed collectively in a state that plural minute structures are formed on the silicon wafer substrate. This makes it possible to save the time and labor for removing the sacrificial layer from each minute structure after cutting.

In the process of stacking the layers in the manner as described above with reference to FIG. 2, an AR coat (anti-reflection film) having low surface reflectivity can be formed by stacking thin films having different refractive indices such as an $SiO_2$ film, a $TiO_2$ film, and a $ZnO_2$ film at a ¼-wavelength thickness by deposition or sputtering. This makes it possible to realize a DOE or an MLA having low reflectivity.

As described above, in the first embodiment of the invention, the alignment marks 103 are formed in the first layer 103. Alternatively, they may be formed on the silicon wafer 101 which is the substrate. In either case, since the first layer 104 and the sacrificial layer 105 are patterned in alignment with the same alignment marks, displacements between resulting patterns are small and hence highly accurate minute structures can be formed.

The resin material(s) of the first layer 104 and the second layer 106 has not been described above. However, the second layer 106 is integrated with the first layer 104 when the former is laid by using the same resin as or a different resin from the resin of the latter. Therefore, it is not necessary to bond the first layer 104 and the second layer 106 to each other after the sacrificial layer 105 is removed, and hence a minute structure having a hollow portion can be manufactured efficiently. In particular, the integration is advantageous in forming a fragile structure such as a lens or a moth-eye-type antireflection film which is used for a display panel antireflection purpose, because the inside structures are less prone to be exposed to the outside air and hence inside precise prongs etc. of the minute structure can be protected.

Second Embodiment

Next, a second embodiment relating to a minute structure and its manufacturing method will be described. A minute structure according to the second embodiment of the invention is configured in such a manner that a first member having concave alignment marks and a second member having convex alignment marks that are paired with the respective concave ones are fitted with and into each other. The minute structure manufactured by this embodiment is used as an optical element and, in particular, suitably used as a minute optical element formed on a semiconductor element.

The manufacturing method of the second embodiment will be outlined below. First, a mold master for one of the first member or the second member is produced by precision machining and a first reverse mold master is produced from the mold master by nanoimprinting or the like. Then, a sacrificial layer corresponding to a hollow portion is laid on the first reverse mold master, and patterned into a desired shape such as a DOE pattern. A second reverse mold master is produced by resin molding from a resulting structure. Then, mold sub-masters corresponding to the first and second reverse mold masters, respectively, are produced. That is, a first sub-master is produced from the first reverse mold master and a second sub-master is produced from the second reverse mold master. In mass production, first members and second members are resin-molded in large numbers from these sub-masters and minute structures are manufactured by fitting first and second members with and into each other.

Although the mold master may be made of any material that enables accurate processing such as glass, quartz, nickel, or brass, pattern formation needs to be performed by selecting a proper processing method such as machining or etching for a material used.

Figure 4:
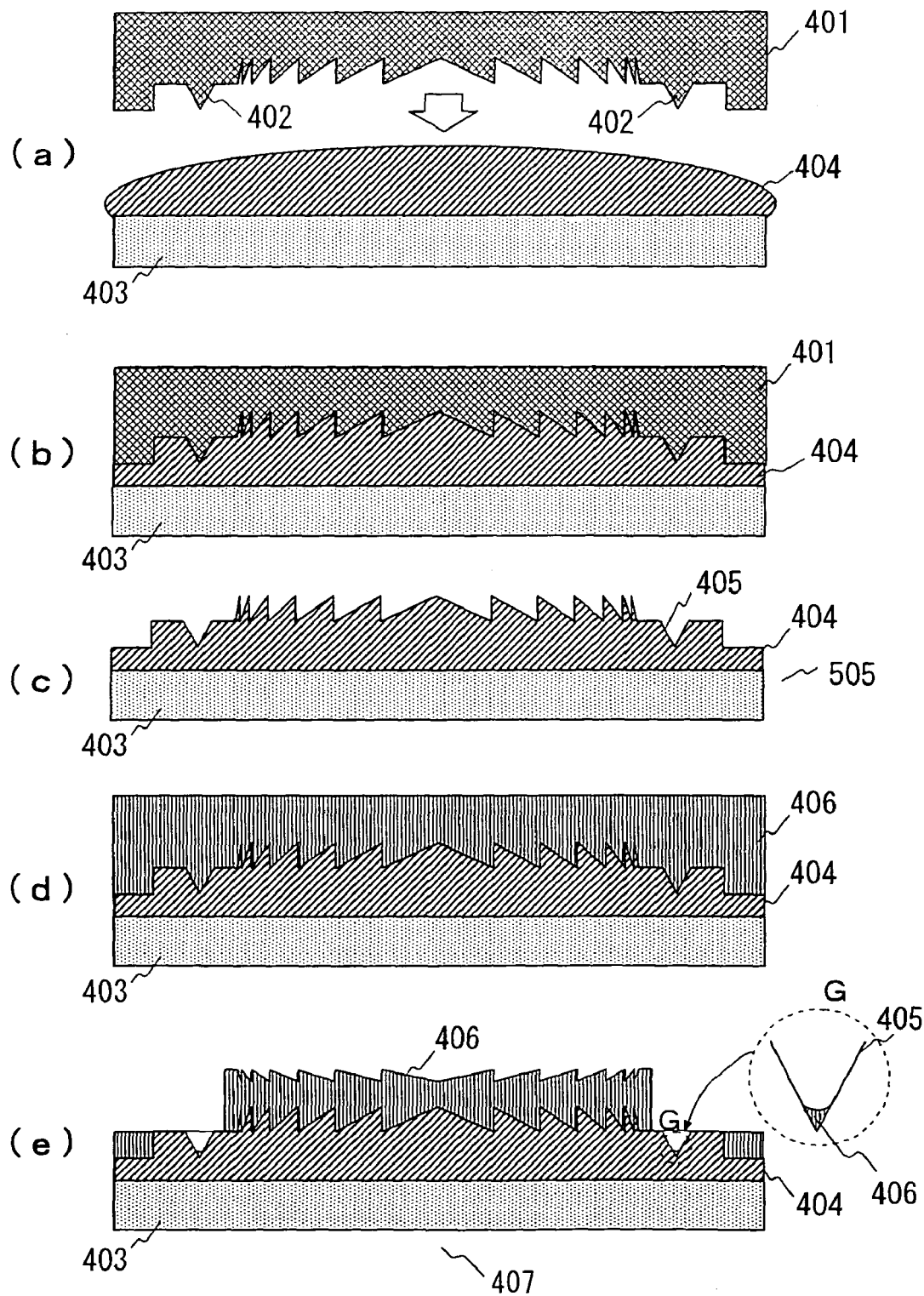
FIG. 4 is explanatory diagrams showing a manufacturing procedure of a second embodiment of the invention.

The manufacturing method according to the second embodiment will be described in detail with reference to FIGS. 4-7. FIG. 4 shows a procedure for producing a first reverse mold master and a procedure for producing a mold for producing a second reverse mold master using the first reverse mold master. Reference numeral 401 denotes a master; 402, convex alignment marks on the master; 403, a substrate made of silicon, glass, or the like; 404, a resin; 405, concave alignment marks formed by transcribing the convex alignment marks of the master onto the resin 404; 406, a photoresist sacrificial layer; 505, a first reverse mold master; and 407, a mold for a second reverse mold master is made of the substrate 403, the resin 404, and a sacrificial layer patterned by photolithography. When a master 401 produced by performing precision processing on quartz or the like is pressed against a resin 404 mounted on a substrate 403 (see FIG. 4(a)), the resin 404 is molded so as to conform to the shape of the master 401 (see FIG. 4(b)). In this state, the resin 404 is solidified by cooling or applying ultraviolet rays to it in the case where the resin 404 is an ultraviolet hardening resin. A first reverse mold master which is a reverse mold of the master 401 is completed as shown in FIG. 4(c) by separating the master 401. Air may be interposed during such a transcript process using a resin. However, this problem can be solved by executing this process in vacuum.

Then, to produce a second reverse mold master, as shown in FIG. 4(d), a photoresist sacrificial layer 406 is spread on the first reverse mold master. A mold for producing a second reverse mold master is formed as shown in FIG. 4(e) by patterning the sacrificial layer 404 by photolithography and removing unnecessary portions. A broken-line circle G shows an extraction of a bottom portion of a concave alignment mark 405. The portion of the mold 407 for a second reverse mold master that corresponds to the alignment mark 405 has the same abbreviation circle shape as the alignment mark 405 of the first reverse mold master 505. The development of the photography process is performed so that a fragment of the sacrificial layer 406 is left intentionally in the bottom portion of each V-shaped, concave alignment mark 405. The shape of each concave alignment mark 405 may be such that its surfaces are inclined in cross section; for example, it may assume a conical shape, a quadrangular pyramid shape, or a V shape. The shape of the alignment marks will be described later in detail.

Figure 5:
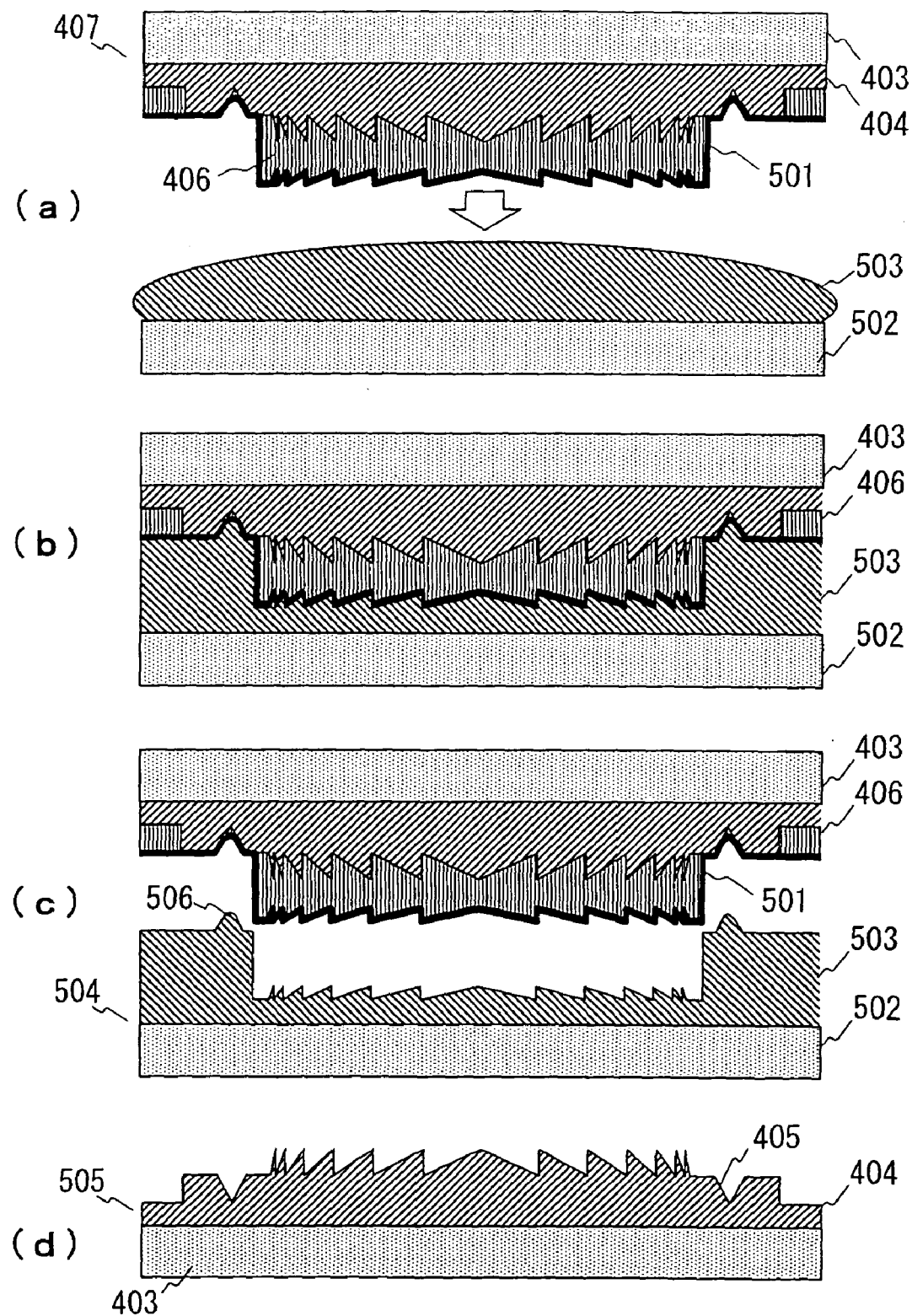
FIG. 5 is explanatory diagrams showing the manufacturing procedure of the second embodiment of the invention.

FIG. 5 illustrates a process for producing a second reverse mold master using the mold 407 for a second reverse mold master produced by using the first reverse mold master 505. In FIG. 5, reference numeral 501 denotes a mold lubricant; 502, a substrate; 503, a resin; 504, a second reverse mold master; and 506, alignment marks of the second reverse mold master 504. When as shown in FIG. 5(a) the mold 407 for a second reverse mold master is pressed against a resin 503 which is placed on a substrate 502, as shown in FIG. 5(b) the resin 503 is molded via the mold lubricant 501 so as to conform to the shape of the mold 407 for a second reverse mold master. The resin 404 is solidified by cooling or applying ultraviolet rays to it in the case where the resin 404 is an ultraviolet hardening resin. As shown in FIG. 5(c), a second reverse mold master 504 is completed which is a reverse mold of the mold 407 for a second reverse mold master by separating the mold 407 for a second reverse mold master which is made apt to be released by the mold lubricant 501. Alignment marks 506 of the second reverse mold master 504 are approximately reverse in shape to the alignment marks 402 of the first reverse mold master 505.

The mold lubricant 501 and the sacrificial layer 406 are removed from the mold 407 for a second reverse mold master by using chemicals or the like, whereby it is returned to the state of the first reverse mold master 505 as shown in FIG. 5(d). In this manner, the first reverse mold master 505 and the second reverse mold master 504 are completed which are approximately reverse to each other in the shape of the portions corresponding to the alignment marks. The above description refers to the use of the mold lubricant 501. More specifically, increasing the mold releasability by spreading a fluorine-type mold lubricant or doing surface treatment for increasing the releasability not only facilitates the work but also eliminates the risk that a complex pattern formed is broken when the mold is separated.

Figure 6:
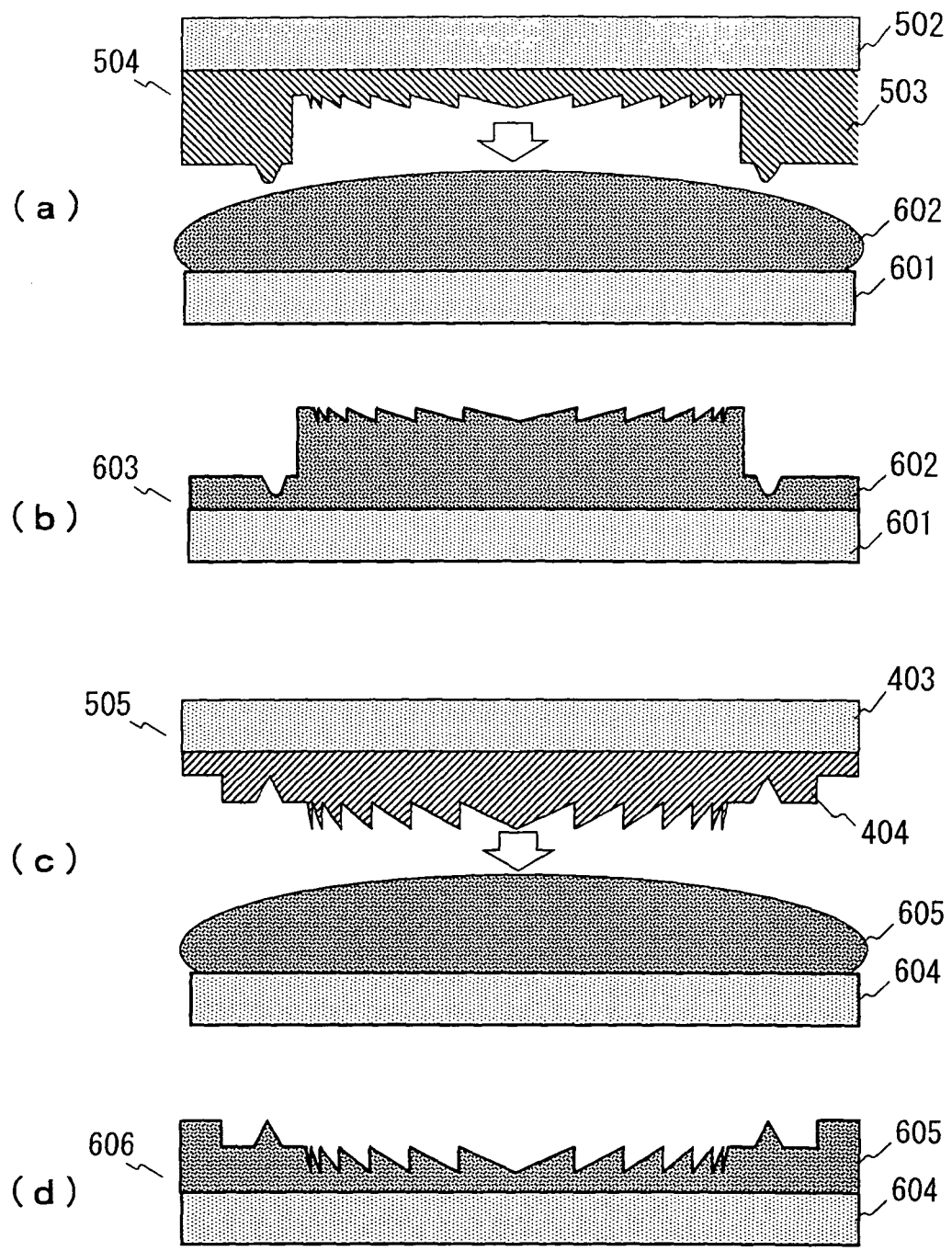
FIG. 6 is explanatory diagrams showing how to produce sub-masters in the second embodiment of the invention.

Next, a process of producing a first sub-master and a second sub-master using the first reverse mold master 505 and the second reverse mold master 504 will be described with reference to FIG. 6. In FIG. 6, reference numeral 601 denotes a substrate for a second sub-master; 602, a resin; 603, a second sub-master; 604, a substrate for a first sub-master; 605, a resin; and 606, a first sub-master. When as shown in FIG. 6(a) the second reverse mold master 504 is pressed against a resin 602 that is spread on a substrate 601, the resin 602 is molded so as to conform to the shape in the same manner as shown in FIG. 4(a), for example. A second sub-master 603 is completed as shown in FIG. 6(b) by separating the second reverse mold master 504 after the resin is solidified. Likewise, when as shown in FIG. 6(c) the first reverse mold master 505 is pressed against a resin 605 that is spread on a substrate 604, the resin 605 is molded so as to conform to the shape. A first sub-master 606 is completed as shown in FIG. 6(d) by separating the first reverse mold master 505 after the resin is solidified. In the above description, for convenience of description, after the second reverse mold master 504 is produced as shown in FIG. 5(d), the mold lubricant 501 and the sacrificial layer 406 are removed from the mold 407 for a second reverse mold master and it is thereby returned to the state of the first reverse mold master 505 to produce a first sub-master. However, actually, processing for producing a mold 407 for a second reverse mold master is performed after a first sub-master 606 is completed first from the first reverse mold master 505 in the above-described manner. This processing order makes the removal process unnecessary. Furthermore, irreversible methods can be used for producing a mold 407 for the second reverse mold master. For example, instead of using a resist as the sacrificial layer 406, cutting may be performed after a metal material is electrodeposited.

Figure 7:
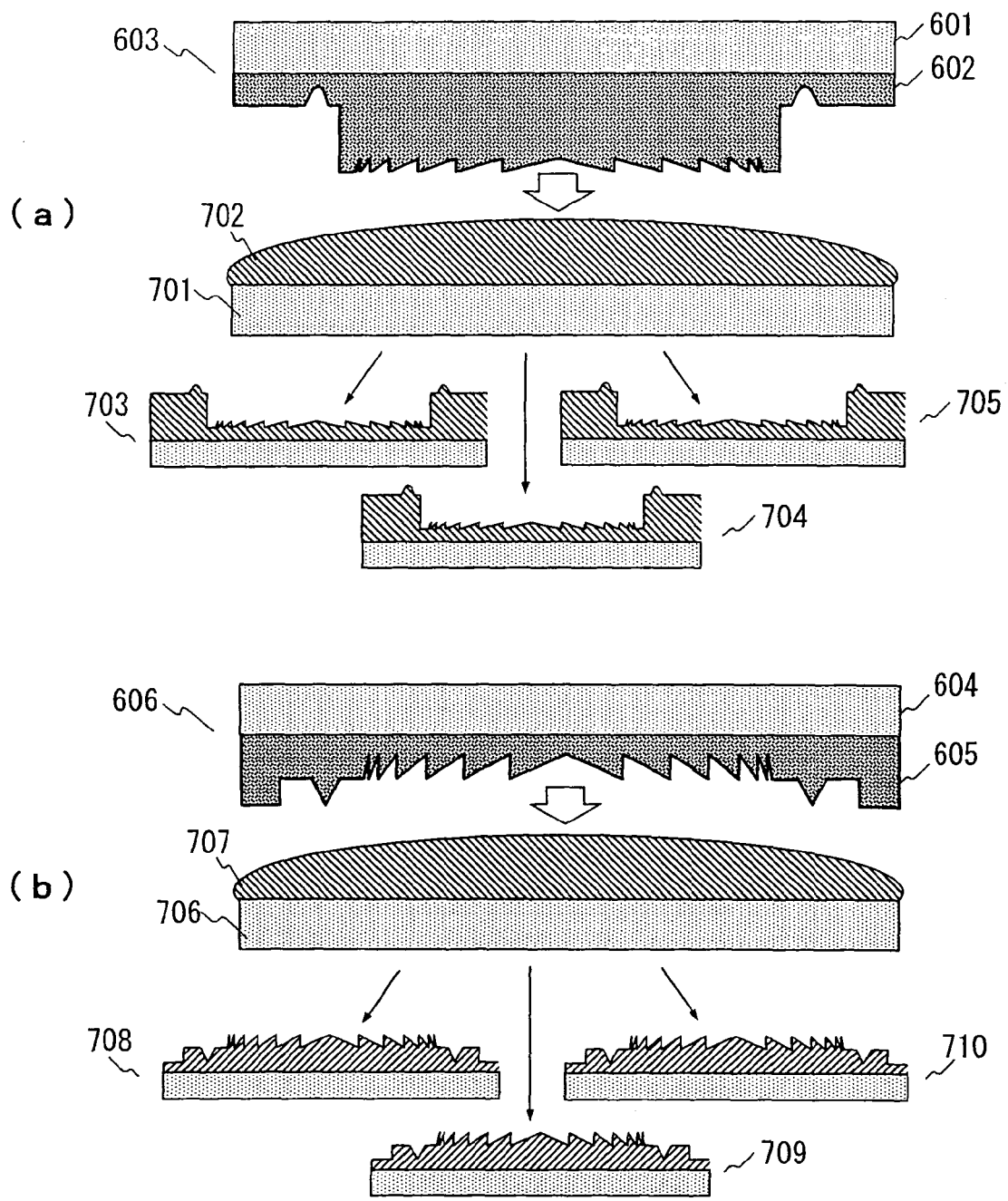
FIG. 7 is explanatory diagrams conceptually showing how to manufacture a minute structure in the second embodiment of the invention.

FIG. 7 conceptually shows how minute structures are mass-produced by using the thus-produced sub-masters. FIGS. 7(a) and 7(b) conceptually show how a second member and a first member of a minute structure are manufactured from the second sub-master 603 and the first sub-master 606, respectively. In FIG. 7, reference numeral 701 denotes a substrate on which to form a second member of a minute structure; 702, a resin; 703-705, some of second members molded in a large number; 706, a substrate on which to form a first member of the minute structure; 707, a resin; and 708-710, some of first members molded in a large number.

The shapes of the mold portions of the first sub-master 606 for forming alignment marks of a first member and the shapes of the mold portions of the second sub-master 603 for forming alignment marks of a second member are formed from the same master 401 (see FIG. 4). The shapes of these portions of the first sub-master 606 are formed by an even number of (two) transcript operations and the shapes of these portions of the second sub-master 603 are formed by an odd number of (three) transcript operations. Therefore, the concave or convex alignment mark portions of the first members 708-710 and the second members 703-705 which are mass-produced by using these sub-masters can be fitted with and into each other with high accuracy.

Incidentally, the minute structure manufactured by the above-described manufacturing method is used as an optical element. The materials of the first member 708 and the second member 703 are transparent at a wavelength used, and a relief pattern (e.g., DOE pattern or lens pattern) that causes a desired optical characteristic for obtaining a necessary diffraction phenomenon, for example, at the wavelength used is formed on each member. A minute structure (minute optical element) having a hollow structure according to the embodiment is obtained by fitting the alignment mark portions of the first member 708 and the second member 703 with and into each other. This minute optical element can be used for the same purposes as the minute optical element described in the first embodiment. Forming the minute structure in the above-described manner facilitates accurate positioning between the two members. Furthermore, by virtue of the structure that the concave alignment marks and the convex alignment marks are fitted with and into each other, the mechanical strength of the optical element according to the embodiment is high.

An AR coat having low surface reflectivity can be formed by stacking, on the surfaces of the molded first and second members, thin films having different refractive indices such as an $SiO_2$ film, a $TiO_2$ film, and a $ZnO_2$ film at a ¼-wavelength thickness by vacuum deposition or sputtering. As in the first embodiment, this makes it possible to realize a low-reflectivity product in the case of a DOE, an MLA, or the like.

Figure 8:
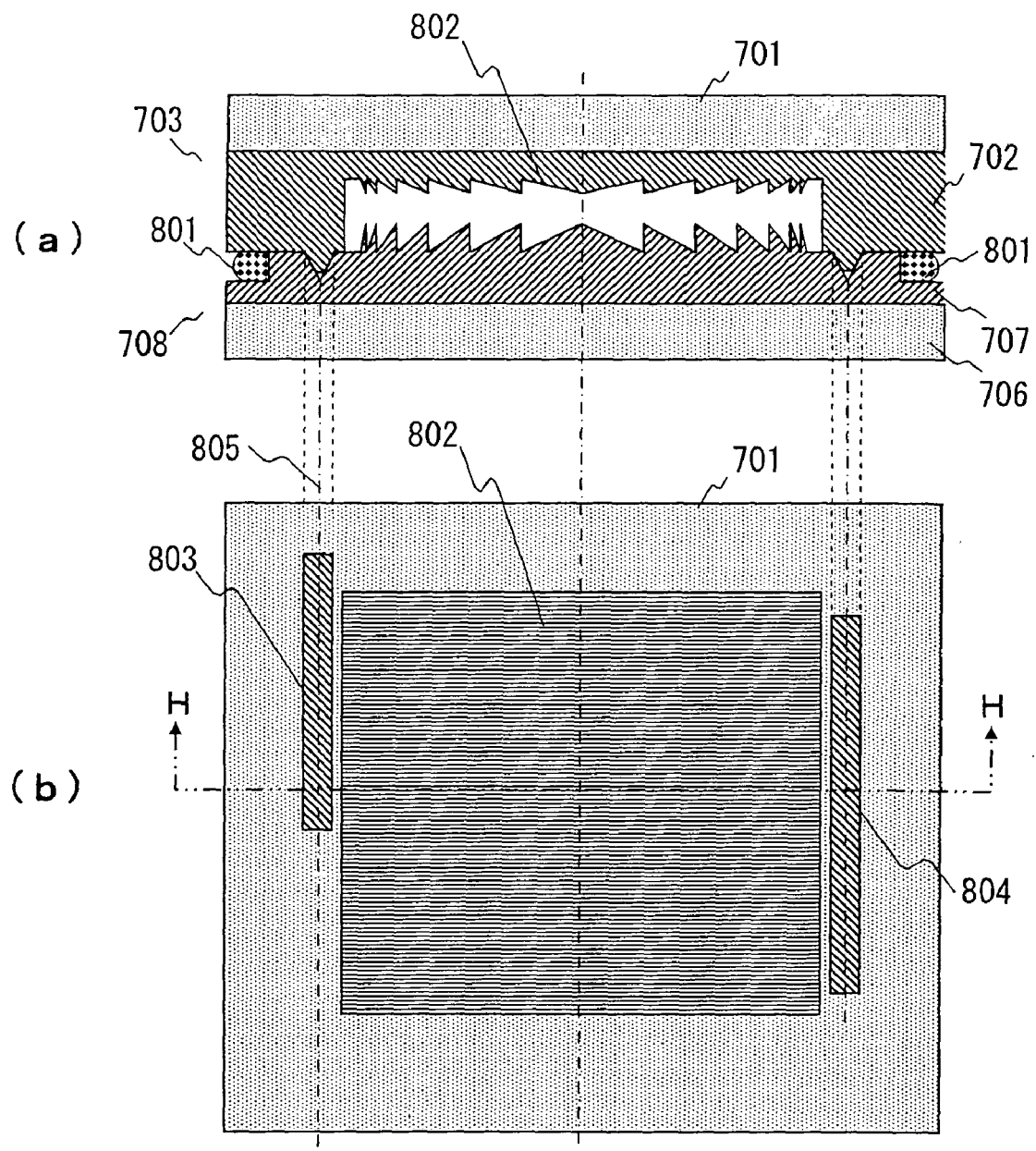
FIG. 8 is explanatory diagrams of exemplary alignment marks.

Next, an example of the shape of alignment marks will be described with reference to FIG. 8. FIG. 8 shows an example of the shape of alignment marks of a minute structure in which a first member 708 and a second member 703 are fitted with and into each other. Reference numeral 801 denotes an adhesive; 802, an area where a pattern of a DOE or the like is formed; 803 and 804, V-shaped alignment marks; and 805, the center line of each alignment mark 803. FIG. 8(a) is a sectional view taken at a cutting position H in FIG. 8(b). FIG. 8(b) is a see-though top view of the minute structure in which the adhesive 801 etc. are omitted. Since the surfaces of the V-shaped alignment mark 803 of the first member 708 having a concave alignment mark are inclined in extending from the opening to the center line 805 which is located at the bottom, when the convex alignment marks of the second member 703 are fitted into the concave alignment marks, the convex alignment marks fall toward the center lines 805 and hence their displacements from the center lines 805 are small.

The V-shaped alignment marks 803 and 804 provide the same advantage irrespective of whether they are long or short. They may assume a U shape or the like instead of the V shape; the same advantage can be obtained as long as the surfaces are inclined in extending from the opening to the bottom which is indicated by the center line 805.

Figure 9:
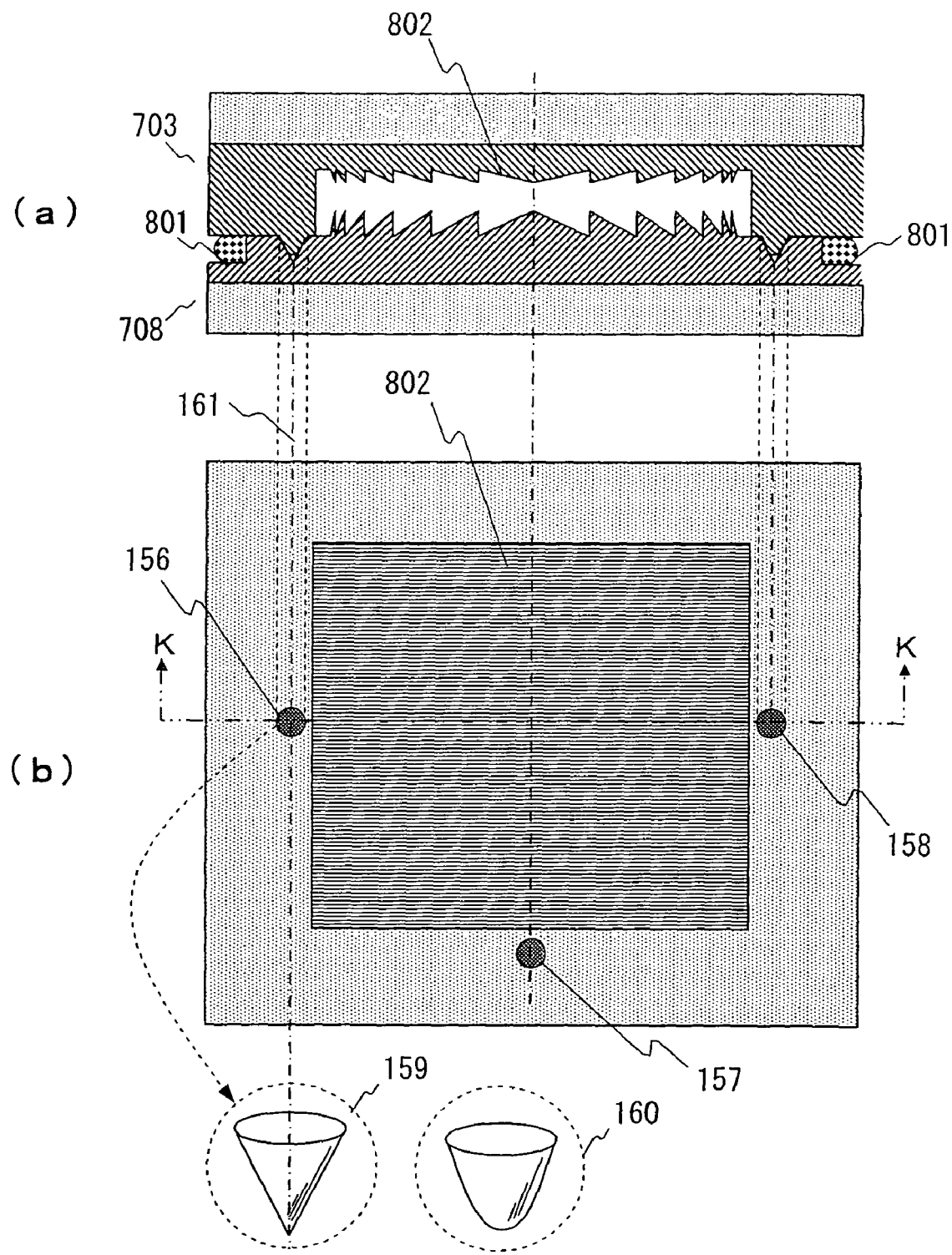
FIG. 9 is explanatory diagrams of another set of exemplary alignment marks.

Next, another example of the shape of alignment marks will be described with reference to FIG. 9. FIG. 9 is the same as FIG. 8 except the shape of alignment marks. Reference numerals 156, 157, and 158 denote conical alignment marks. A perspective view showing the shape of a conical alignment mark three-dimensionally is in a broken-line circle 159. A perspective view showing a convex alignment mark which is paired with the concave alignment mark 159 is in a broken-line circle 160. Reference numeral 161 denotes the center of the conical alignment mark 156. FIG. 9(a) is a sectional view taken at a cutting position K in FIG. 9(b). FIG. 9(b) is a see-though top view of a minute structure.

Since three concave, conical alignment marks 156, 157, and 158 are formed in a first member 708, the position is fixed in both front-rear direction and the right-left direction. In particular, since the surface of each concave, conical alignment mark is inclined in extending from the opening to the bottom as indicated in the broken-line circle 159, each convex alignment mark as shown in the broken-line circle 160 falls toward the center 161 and hence the position is fixed accurately. In addition, since the tip portion of each convex alignment mark is rounded rather than pointed as indicated in the broken-line circle 160, the tip does not reach the bottom of the concave alignment mark, which prevents a lift that would otherwise occur due to a very small difference in molding accuracy. Such rounded convex alignment marks can be produced by a process as described above with reference to FIG. 4 (part G). Also in this example, as described above with reference to FIG. 8, the alignment marks may assume a U shape. The point is that the surface of each concave alignment mark be inclined at an angle other than the right angle in extending from the opening toward the inner part of the concave shape, that is, each concave alignment mark be narrowed as the position goes toward the bottom.

Next, other exemplary minute structures manufactured by the manufacturing method according to the invention will be described with reference to FIGS. 10-13.

Figure 10:
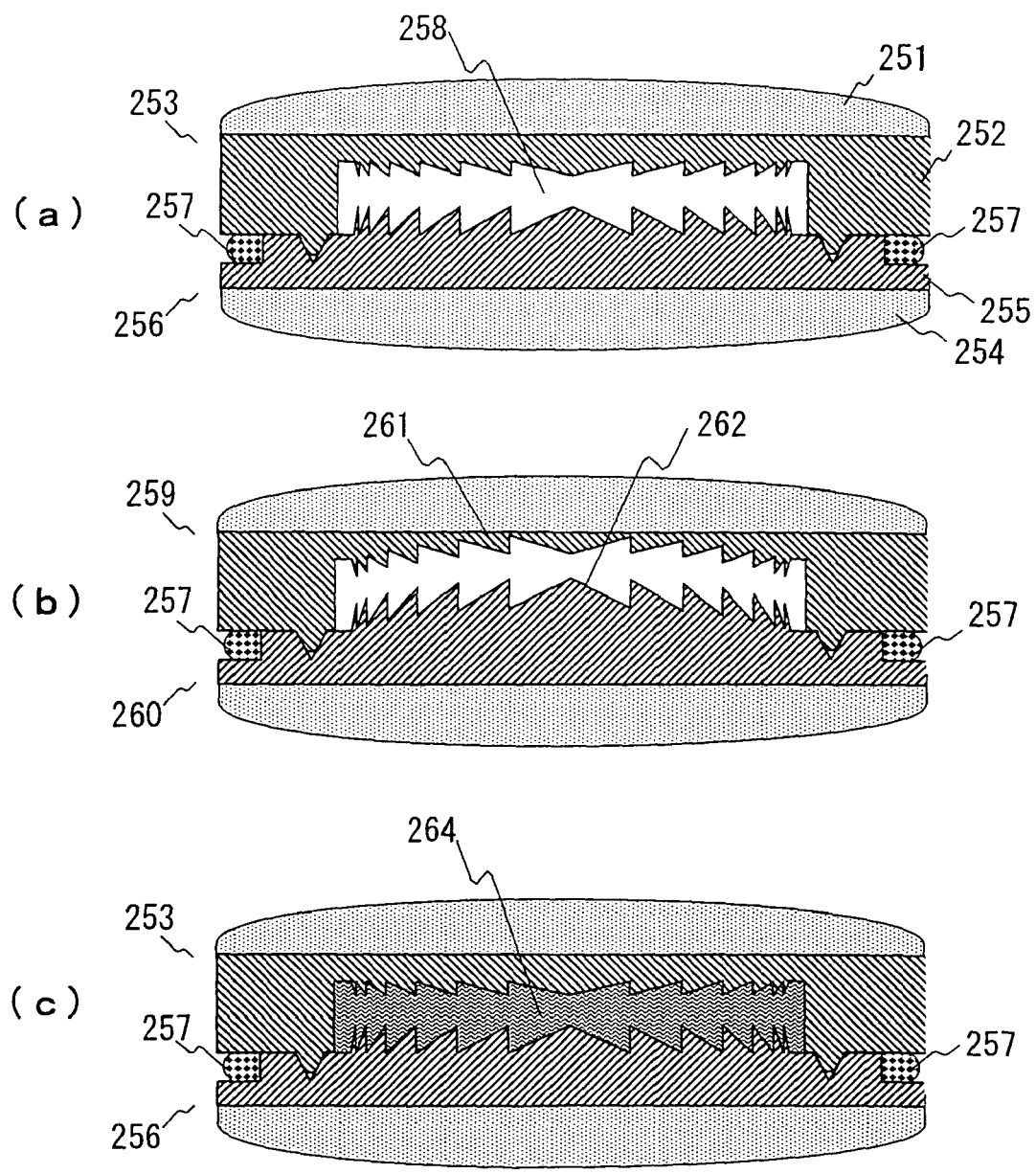
FIG. 10 is explanatory diagrams showing minute structure as application examples.

Although in the second embodiment the substrate has a flat-plate shape, a minute structure can be manufactured by the same process as described in the embodiment even in the case of using curved-surface substrates as shown in FIG. 10. FIG. 10(a) is a sectional view of a DOE minute structure which has curved-surface substrates. FIG. 10(b) is a sectional view of a minute structure which is different from the minute structure of FIG. 10(a) in that DOE shapes are also curved.

FIG. 10(*c*) is a sectional view of a DOE minute structure in which a resin having a different refractive index is inserted in the hollow portion of the minute structure of FIG. 10(*a*).

In FIG. 10(*a*), reference numeral 251 denotes a second substrate; 252, a second layer; 253, a first member having a curved-surface substrate which consists of the second substrate 251 and the second layer 252; 254, a first substrate; 255, a first layer; 256, a second member having a curved-surface substrate which is made of the first substrate 254 and the first layer 255; 257, an adhesive such as an epoxy adhesive; and 258, a hollow portion. The hollow portion 258 is filled with air and the minute structure serves as an ordinary two-plate DOE lens. Each of the first substrate 254 and the second substrate 251 serves as a lens because it is made of a material that is transparent at a wavelength used and has a lens-like curved surface. And the first substrate 254 and the second substrate 251 compensate the focusing of the DOE lens (in particular, of its peripheral portion) which is formed by the first layer 255 and the second layer 252 made of a resin material(s) which is transparent at the wavelength used. Therefore, the pitch of the peripheral portion of the DOE lens can be increased from an original small value, which in turn makes it easier to prevent chipping and to perform accuracy management of acute-angled edge portions during manufacture.

In FIG. 10(*b*), reference numeral 259 denotes a first member having a curved-surface substrate; 260, a second member having a curved-surface substrate; 261, a second layer having a curved-surface DOE; and 262, a first layer having a curved-surface DOE. The first layer 262 and the second layer 261 having curved surfaces can be formed by using a grayscale mask method at the time of patterning, whereby a DOE lens having a more complex characteristic than the DOE lens of FIG. 10(*a*). The patterning can be performed by a method other than exposure, such as a method of cutting a metal with a cutting tool. In particular, to form the pattern shown in FIG. 10(*b*), the cutting is advantageous if the zona orbicularis pitch of the DOE lens is tens of microns.

In FIG. 10(*c*), reference numeral 264 denotes a high-refractivity resin whose refractive index is different from those of the first layer 255 and the second layer 252 shown in FIG. 10(*a*). The filling with a resin having an appropriate refractive index makes it possible to control the diffraction behavior and hence to improve the DOE characteristic. Furthermore, employing a resin 264 made of a resin material that is absorptive at a particular wavelength makes it possible to realize a DOE lens having a filtering function. Alternatively, employing a liquid instead of the resin 264 makes it possible to realize a new characteristic or function.

Figure 11:
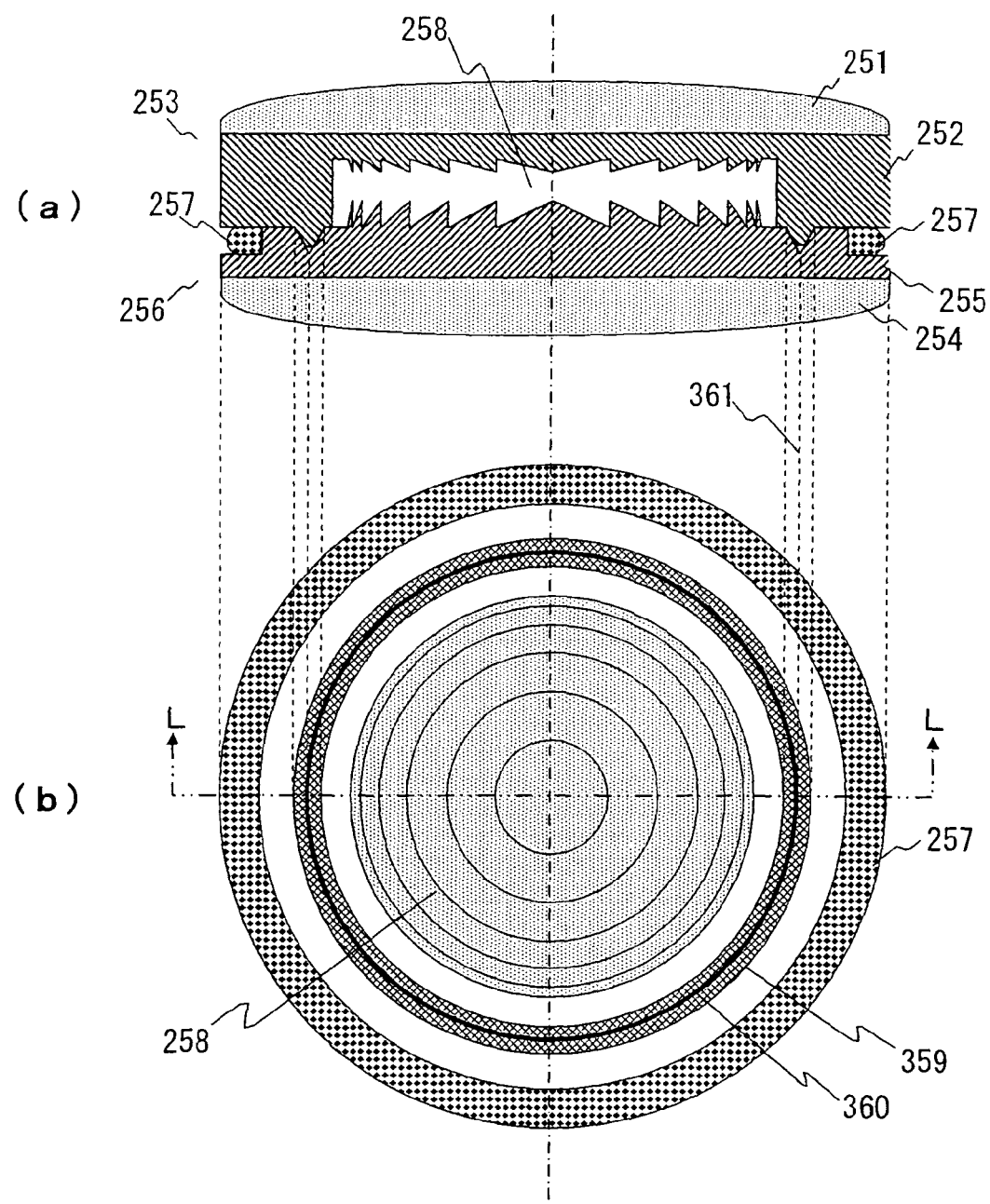
FIG. 11 is explanatory diagrams of another set of exemplary alignment marks.

Next, another example of the shape of alignment marks will be described with reference to FIG. 11. FIG. 11 shows a DOE minute structure having the same curved-surface substrates as shown in FIG. 10(*a*). FIG. 11(*b*) is a see-through top view of the minute structure, and FIG. 11(*a*) is a sectional view taken at a cutting position L. In FIG. 11, reference numeral 359 denotes an alignment mark in which a V-shaped groove surrounds a hollow portion 258 in a ring-like manner. Reference numeral 360 denotes the center line of the V-shaped groove of the alignment mark 359. Reference numeral 361 denotes a broken line showing correspondence between the center line of the V-shaped groove in the sectional view of FIG. 11(*a*) and that in FIG. 11(*b*).

In the minute structure of FIG. 11, a first layer 255 and a second layer 252, in which DOE patterns are formed, are brought in close contact with and fixed to each other with an adhesive 257 so as to be interposed between a first substrate 254 and a second substrate 251 each of which is circular and has a central bulge, where the concave and convex alignment marks 359 are fitted in/with each other. The second layer 252 has the inverted-V-shaped, convex alignment mark and the first layer 255 has the V-shaped, concave alignment mark. Since each of these alignment marks has a ring shape, at the time of fitting they are not deviated from each other in the front-rear direction or the right-left direction and the tip of the inverted-V-shaped, convex alignment mark falls to reach the center line 360 of the V-shaped, concave alignment mark.

Figure 12:
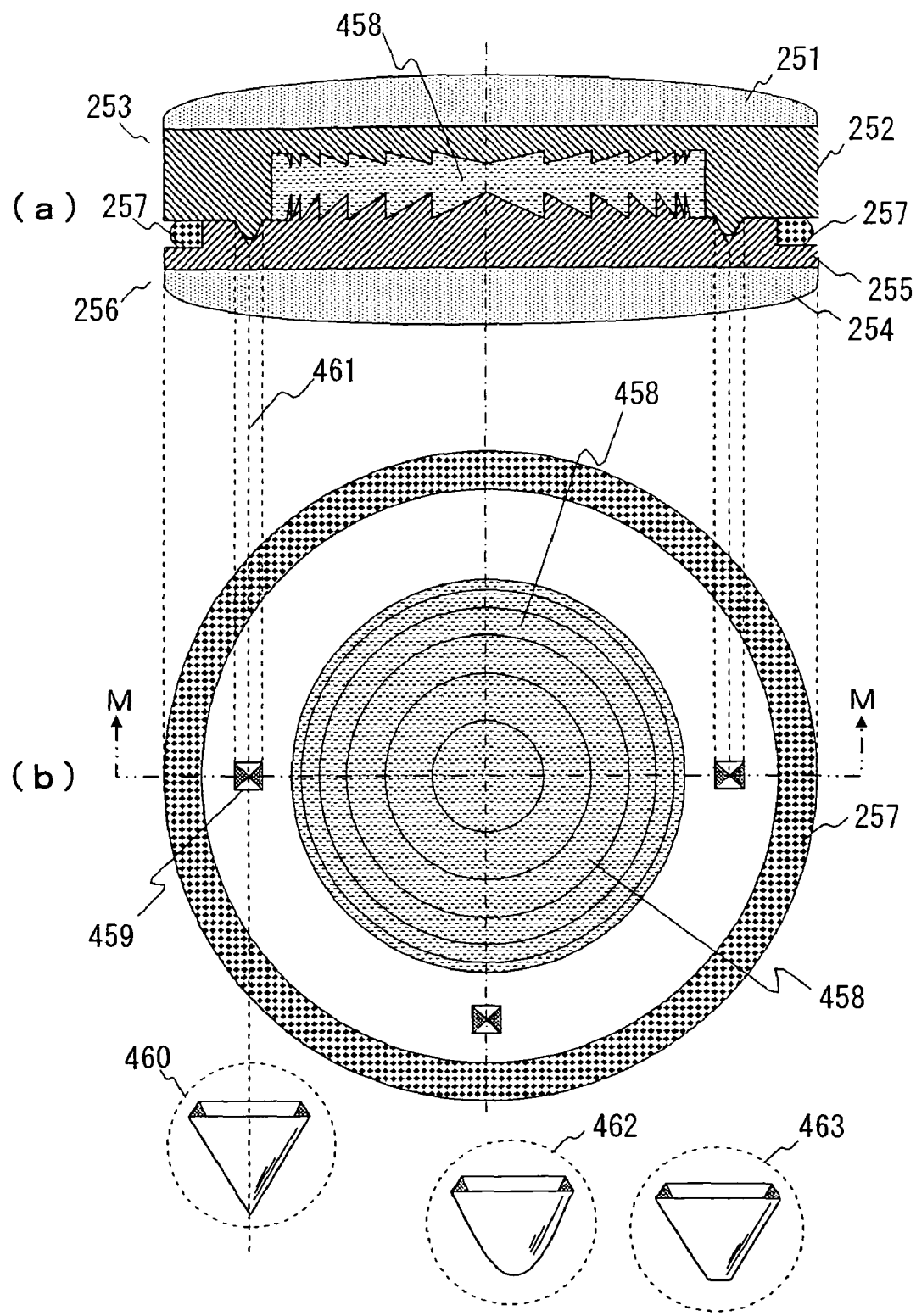
FIG. 12 is explanatory diagrams of a further set of exemplary alignment marks.

Next a further example of the shape of alignment marks will be described with reference to FIG. 12. FIG. 12 shows a DOE minute structure in which the hollow portion shown in FIG. 10(*a*) is filled with a liquid having a different refractive index. FIG. 12(*b*) is a see-through top view of the minute structure, and FIG. 12(*a*) is a sectional view taken at a cutting position M. In FIG. 12, reference numeral 458 denotes a liquid that fills the hollow portion and numeral 459 denotes quadrangular-pyramid-shaped alignment marks. One alignment mark 459 is shown in a broken-like circle 460 three-dimensionally in an enlarged manner. Reference numeral 461 denotes the center of each alignment mark 459. A convex alignment mark that is fitted in the concave alignment mark 459 is shown in a broken-like circle 462 three-dimensionally in an enlarged manner. Another exemplary convex alignment mark which is different from the convex alignment mark 462 is shown in a broken-like circle 463.

In the minute structure of FIG. 12, a first layer 255 and a second layer 252 in which DOE patterns are formed, are brought in close contact with and fixed to each other with an adhesive 257 with the hollow portion filled with the liquid 458, so as to be interposed between a first substrate 254 and a second substrate 251 each of which is circular and has a central bulge, where the concave and convex alignment marks 359 are fitted in/with each other. The conical, convex alignment marks as shown in the broken-line circle 462 are formed in the second layer 252 at three positions, and the conical, concave alignment marks as shown in the broken-line circle 460 are formed in the first layer 255 at three positions. The surfaces of each alignment mark are inclined in extending from the opening to the center 461. Therefore, when the convex alignment marks as shown in the broken-line circle 462 and the concave alignment marks as shown in the broken-line circle 460 are fitted with and into each other, they are not deviated from each other in the front-rear direction or the right-left direction and the former fall toward the centers 461. The tip portions of the convex alignment marks are rounded as shown in the broken-line circle 462. Therefore, since the height of the convex alignment marks as shown in the broken-line circle 462 is smaller than the depth of the concave alignment marks as shown in the broken-line circle 460, at the time of fitting the convex alignment marks do not reach the bottoms and hence can be prevented from lifting due to a very small difference in molding accuracy. The tip-chamfered, convex alignment marks as shown in the broken-line circle 463 can provide the same advantage because of the reduction in height. It is important that the height of the convex portions be smaller than the depth of the concave portions.

The application ranges of the first embodiment and the second embodiment are not limited to the DOE and encompass the MLA etc. For example, in optical fiber couplers, the assembling accuracy is important (e.g., optical axis adjustment etc. need to be performed) particularly in the case where plural optical fibers are coupled each other via a lens. A highly accurate optical fiber coupler with only a small optical axis displacement can be realized by forming a minute structure using its manufacturing method according to the invention in such a manner that microlens arrays are opposed to each other. This makes it possible to accommodate single-mode optical fibers of several microns to tens of microns in diameter. Next, an example of such application to an MLA will be described with reference to FIG. 13.

Figure 13:
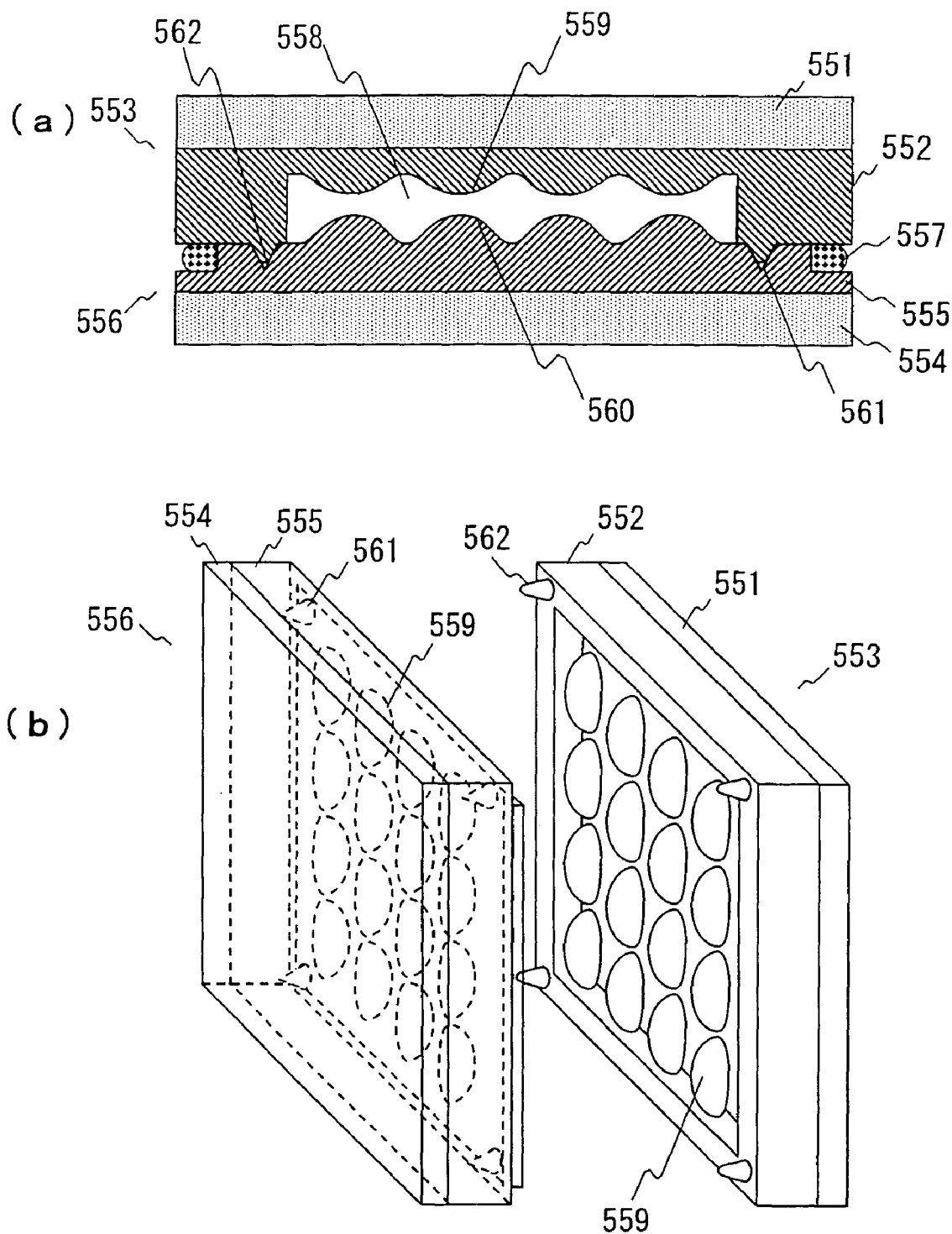
FIG. 13 is explanatory diagrams showing an MLA of a minute structure.

In FIG. 13, reference numeral 551 denotes a second substrate; 552, a second layer; 553, a first member having a curved-surface substrate which is made of the second substrate 551 and the second layer 552; 554, a first substrate; 555, a first layer; 556, a second member having a curved-surface substrate which is made of the first substrate 554 and the first layer 555; 557, an adhesive such as an epoxy adhesive; 558, a hollow portion; 559, an MLA lens pattern formed in the second layer 552; 560, an MLA lens pattern formed in the first layer 555; 561, concave alignment marks formed in the first layer 555; and 562, convex alignment marks formed in the second layer 552.

The hollow portion 558 is filled with air and the minute structure of FIG. 13 serves as an ordinary two-plate MLA lens. The MLA lens patterns 559 and 560 can be produced by the same method as the DOE lens producing method according to the second embodiment which was described above with reference to FIGS. 4-6. That is, as shown in FIG. 4, first, a master 401 for an MLA lens is produced. A first reverse mold master 505 is produced on the basis of the master. When a sacrificial layer 406 is patterned, a pattern corresponding to the MLA lens pattern 559 is formed by a grayscale mask method or the like. A second reverse mold master 504 is then formed as shown in FIG. 5(c). The first member 556 and the second member 553 having the MLA lens patterns can thus be mass-produced by the same process. In addition, since the convex alignment marks 562 and the concave alignment marks 561 are molded on the basis of the sub-masters produced from the same mold master, they can be fitted with and into each other reliably without causing any displacements. The convex alignment marks 562 and the concave alignment marks 561 described above with reference to FIG. 13 have the same shapes as the conical alignment marks that were described above with reference to FIG. 9.

In the MLA lens example of FIG. 13, the individual microlenses are opposed to each other because an optical fiber coupler is assumed. However, a low-loss optical splitter or the like can be realized by arranging lenses formed in the two surfaces in a hound's tooth pattern with high accuracy. Furthermore, a complex refractive index control is enabled by filling the space between the MLA lenses with a resin having a different refractive index in the same manner as described above with reference to FIG. 10(c). Still further, a filtering function can be given by inserting a resin that absorbs light having a particular wavelength.

As described above, in the second embodiment of the invention, since the first member having the concave alignment marks and the second member having the convex alignment marks are produced from the same mold master, the concave and convex alignment mark portions can be fitted with and into each other accurately. That is, the fitting accuracy does not depend on the mechanical accuracy of the mold master. Furthermore, since the height of the convex portions is smaller than the depth of the concave portions, flat portions around the fitting portions of the first member and the second member can be brought into contact with each other reliably (i.e., without producing any gaps). In addition, since the surface(s) of each concave portion is inclined in extending from the opening toward the center of the bottom, fitting can be performed using the centers as references without causing any displacements.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in illustrated and described, and accordingly all suitable modifications and equivalents may be resorted to, falling within the scope thereof.

The invention claimed is:

1. A manufacturing method of a minute structure having fine structures on opposing inner surfaces, comprising the steps of:
   forming a first pattern on a surface of a first layer;
   forming a sacrificial layer on said patterned surface of said first layer;
   forming a second pattern on a surface of said sacrificial layer;
   forming a second layer on said sacrificial layer and a portion of said surface of said first layer; and
   removing a member constituting said sacrificial layer, said manufacturing method further comprises:
   in said step of forming said first pattern on said first layer and said step of forming said second pattern on said sacrificial layer, said patterns are formed using same alignment marks as references.

2. The manufacturing method of a minute structure according to claim 1, wherein said first layer is formed on a substrate and said alignment mark is formed on said substrate.

3. The manufacturing method of a minute structure according to claim 2, wherein a second substrate is provided on said second layer.

4. The manufacturing method of a minute structure according to claim 1, wherein a material constituting said second layer is such as to be able to be integrated with a material constituting said first layer.

5. The manufacturing method of a minute structure according to claim 1, comprising the steps of:
   forming said second layer so that said sacrificial layer is covered with said second layer; and
   exposing a portion of said sacrificial layer by removing a portion of one of said first layer and said second layer.

6. The manufacturing method of a minute structure according to claim 5, further comprising the step of attaching a cover to an exposed portion of said sacrificial layer after removing said member constituting said sacrificial layer through said exposed portion.

7. The manufacturing method of a minute structure according to claim 1, further comprising the step of forming a thin film between said first layer and said sacrificial layer.

8. The manufacturing method of a minute structure according to claim 1, wherein said sacrificial layer is made of a photoresist and said second pattern is formed by photolithography.

9. The manufacturing method of a minute structure according to claim 1, further comprising the step of filling a hollow portion that is obtained by removing said member constituting said sacrificial layer with a medium other than air.

10. A minute optical element in which a hollow portion is formed inside so as to be surrounded by a structure made of an optical material that transmits light having a wavelength used, wherein:

the structure is formed of a resin material positioned on one side of a single substrate, the hollow portion of said structure has such three-dimensional shapes so as to be able to provide a desired optical characteristic for the light having said wavelength used, and the hollow portion of said structure has an opening to an outside space.

11. The minute optical element according to claim 10, further comprising a sealing member which covers said opening.

12. The minute optical element according to claim 10, wherein the hollow portion of the structure has relief patterns that cause a prescribed diffraction phenomenon for the light having said wavelength used.

13. The minute optical element according to claim 10, wherein said optical material is a resin material.

14. The minute optical element according to claim 10, wherein the structure formed on the substrates is made of one of a glass and silicon in areas of said structure that face said outside space.

* * * * *